United States Patent
Polley et al.

(10) Patent No.: US 11,353,519 B1
(45) Date of Patent: Jun. 7, 2022

(54) HALL SENSOR CIRCUIT

(71) Applicant: TEXAS INSTRUMENTS INCORPORATED, Dallas, TX (US)

(72) Inventors: Arup Polley, Richardson, TX (US); Srinath M. Ramaswamy, Murphy, TX (US); Jo Bito, Dallas, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/114,589

(22) Filed: Dec. 8, 2020

(51) Int. Cl.
*G01R 33/00* (2006.01)
*G01R 33/07* (2006.01)

(52) U.S. Cl.
CPC ....... *G01R 33/0029* (2013.01); *G01R 33/075* (2013.01)

(58) Field of Classification Search
CPC .............. G01R 33/0029; G01R 33/075; G01R 33/0041
See application file for complete search history.

(56) References Cited

U.S. PATENT DOCUMENTS

| | | | |
|---|---|---|---|
| 10,197,638 B2 | 2/2019 | Polley et al. | |
| 2009/0212765 A1* | 8/2009 | Doogue | G01R 33/07 324/202 |
| 2020/0064382 A1* | 2/2020 | Takata | G01R 19/15 |
| 2020/0363559 A1* | 11/2020 | Keene | G01V 3/08 |

* cited by examiner

*Primary Examiner* — Christopher E Mahoney
(74) *Attorney, Agent, or Firm* — Michael A. Davis, Jr.; Charles A. Brill; Frank D. Cimino (57) ABSTRACT

A Hall sensor circuit includes a first Hall sensor, a second Hall sensor, a first preamplifier circuit, a second preamplifier circuit, a subtractor circuit, and a duty cycling circuit. The first preamplifier circuit includes an input and an output. The input is coupled to the first Hall sensor. The second preamplifier circuit includes a first input, a second input, and an output. The first input is coupled to the second Hall sensor. The subtractor circuit includes a first input coupled to the output of the first preamplifier circuit, a second input coupled to the output of the second preamplifier circuit, and an output coupled to the second input of the second preamplifier circuit. The duty cycling circuit is coupled to the second preamplifier circuit and the second Hall sensor.

20 Claims, 9 Drawing Sheets

HALL SENSOR CIRCUIT

BACKGROUND

Hall sensors are used to measure magnetic field strength in a variety of applications. For example, Hall sensors may be used in proximity sensing, positioning, speed detection, and current sensing applications. A Hall sensor includes a Hall element that generates a voltage proportional to a magnetic field about the Hall element.

SUMMARY

A Hall sensor circuit includes a first Hall sensor, a second Hall sensor, a first preamplifier circuit, a second preamplifier circuit, a subtractor circuit, and a duty cycling circuit. The first preamplifier circuit includes an input and an output. The input is coupled to the first Hall sensor. The second preamplifier circuit includes a first input, a second input, and an output. The first input is coupled to the second Hall sensor. The subtractor circuit includes a first input coupled to the output of the first preamplifier circuit, a second input coupled to the output of the second preamplifier circuit, and an output coupled to the second input of the second preamplifier circuit. The duty cycling circuit is coupled to the second preamplifier circuit and the second Hall sensor.

In another example, a Hall sensor circuit includes a first Hall sensor, a second Hall sensor, a first preamplifier circuit, a second preamplifier circuit, a subtractor circuit, and a magnetic concentrator. The first Hall sensor is configured to operate in a current spinning mode. The second Hall sensor is configured to operate in a non-current spinning mode. The first preamplifier circuit includes an input and an output. The input is coupled to a first Hall sensor. The second preamplifier circuit includes a first input, a second input, and an output. The first input is coupled to a second Hall sensor. The subtractor circuit includes a first input coupled to the output of the first preamplifier circuit, a second input coupled to the output of the second preamplifier circuit, and an output coupled to the second input of the second preamplifier circuit. The magnetic concentrator is aligned with the second Hall sensor.

In a further example, a Hall sensor includes a first Hall sensor, a second Hall sensor, a magnetic concentrator, a first preamplifier circuit, a second preamplifier circuit, a subtractor circuit, a first duty cycling circuit, and a second duty cycling circuit. The first Hall sensor is configured to operate in a current spinning mode. The second Hall sensor is configured to operate in a non-current spinning mode. The magnetic concentrator is aligned with the second Hall sensor. The first preamplifier circuit includes an input and an output. The input is coupled to the first Hall sensor. The second preamplifier circuit includes a first input, a second input, and an output. The first input is coupled to the second Hall sensor. The subtractor circuit includes a first input coupled to the output of the first preamplifier circuit, a second input coupled to the output of the second preamplifier circuit, and an output coupled to the second input of the second preamplifier circuit. The first duty cycling circuit is configured to power cycle the first preamplifier circuit, the subtractor circuit, and the first Hall sensor at a first rate. The second duty cycling circuit is configured to power cycle the second preamplifier circuit and the second Hall sensor at a second rate.

DETAILED DESCRIPTION

In Hall sensor circuits, offset voltage limits sensitivity by limiting the ability of the sensor to detect low level magnetic fields. A technique referred to as "current spinning" may be employed to reduce offset in Hall sensor circuits. In a Hall sensor operated in a current spinning mode, the Hall sensor includes contacts arranged symmetrically with respect to a given rotation angle. For example, a Hall sensor may include four contacts arranged at respective 90° angles to one another, eight contacts arranged at respective 45° angles to one another, etc. The direction of current flow in the Hall sensor is made to "spin" by contact commutation, and averaging the output voltages generated via the "spinning" reduces offset voltage.

The time needed for generating and averaging a Hall sensor's output voltages using "current spinning" may be relatively long (e.g., 20 microseconds or more for four phases of current spinning). As result, the power consumption of the Hall sensor circuit may be relatively high because the Hall sensor and associated circuitry are powered for the entire "spinning" time.

The Hall sensor circuits described herein provide reduced offset voltage while reducing power consumption. The Hall sensor circuits include a first Hall sensor that is operated in a spinning mode, and a second Hall sensor that is operated in non-spinning mode. Offset is determined as a difference of output voltage of the non-spinning Hall sensor and the averaged output voltages of the spinning Hall sensor. The offset value is stored and subtracted from the output voltage of the non-spinning Hall sensor. Power consumption of the Hall sensor circuit is reduced by duty cycling the non-spinning Hall sensor at a first rate, and duty cycling the spinning Hall sensor at a second rate that is slower than the first rate.

Sensitivity of the Hall sensor circuits described herein may also be increased by aligning a magnetic concentrator with the non-spinning Hall sensor, and aligning a magnetic concentrator with the spinning Hall sensor. The Hall sensor circuits may be integrated, and the magnetic concentrators may be deposited over the Hall sensors as part of the integrated circuit fabrication process.

Figure 1:
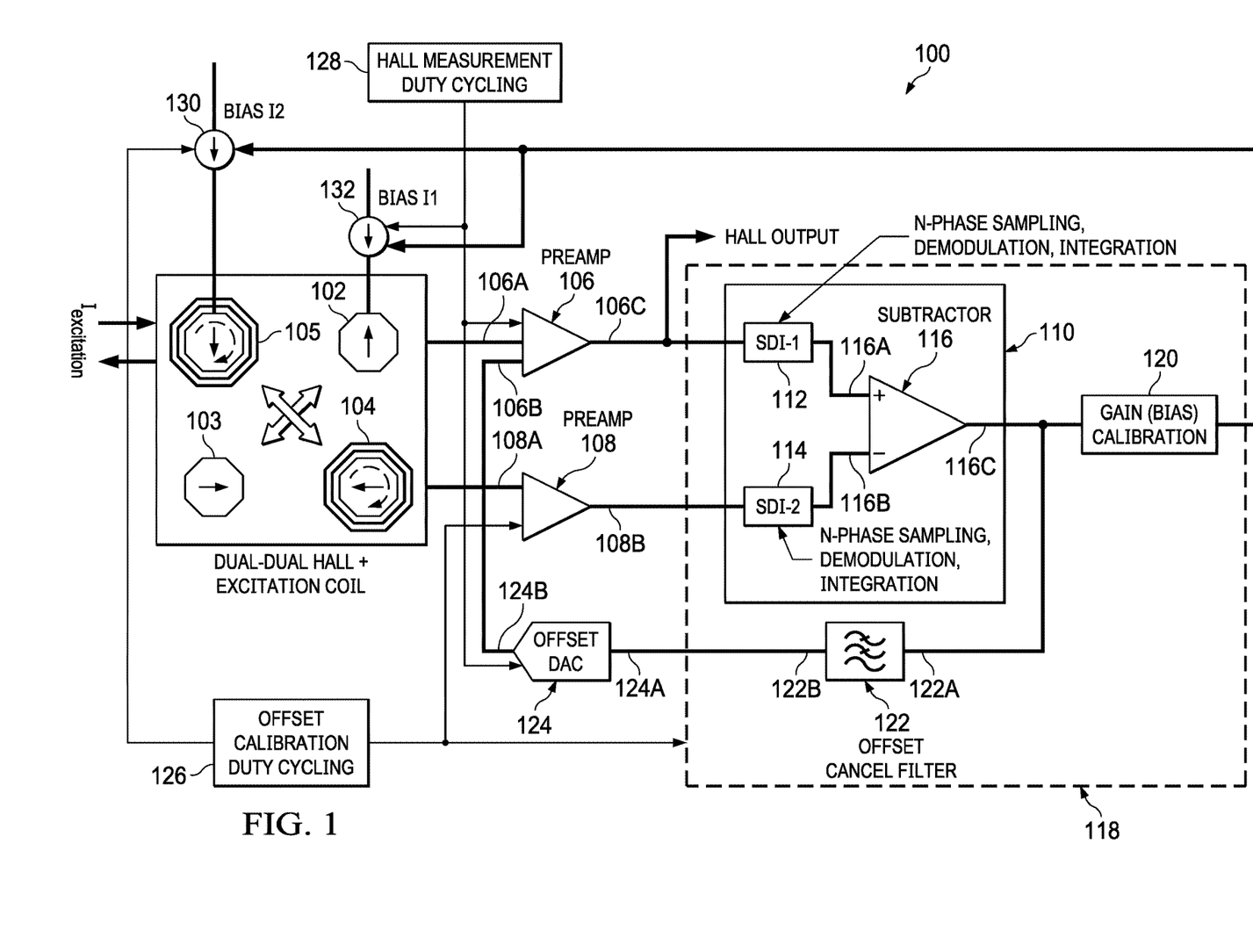
FIG. 1 illustrates an example Hall sensor circuit that includes duty cycling as described herein.

FIG. 1 illustrates an example Hall sensor circuit 100 that includes duty cycling as described herein. The Hall sensor circuit 100 includes one or more Hall sensors operated in a current spinning mode and one or more Hall sensors operated in in non-current spinning mode. FIG. 1 shows Hall sensor 102 and 103 operating in non-current spinning mode, and Hall sensors 104 and 105 operating in current spinning mode. The Hall sensor 102 and the Hall sensor 103 are coupled to, and driven by, a bias current source 132. The Hall sensor 104 and the Hall sensor 105 are coupled to, and driven by, a bias current source 130.

A preamplifier circuit 106 amplifies output signal produced by the Hall sensor 102 and the Hall sensor 103. The preamplifier circuit 106 includes an input terminal 106A that is coupled to the Hall sensor 102. A preamplifier circuit 108 amplifies output signal produced by the Hall sensor 104. The preamplifier circuit 108 includes an input terminal 108A that is coupled to the Hall sensor 104. The preamplifier circuit 106 and the preamplifier circuit 108 are coupled to subtraction circuitry 110.

The subtraction circuitry 110 includes sampling, demodulation, and integration (SDI) circuitry 112, SDI circuitry 114 and subtractor circuit 116. The SDI circuitry 112 samples the amplified Hall sensor output signal produced by the preamplifier circuit 106, demodulates, and integrates the sampled output of the Hall sensor 102. Similarly, the SDI circuitry 114 samples the amplified Hall sensor output signal produced by the preamplifier circuit 108, demodulates, and integrates the sampled output of the Hall sensor 104.

The subtractor circuit 116 is coupled to the preamplifier circuit 106 and the preamplifier circuit 108 via the SDI circuitry 112 and the SDI circuitry 114. The subtractor circuit 116 subtracts the output of the Hall sensor 104 from the output of the Hall sensor 102. The subtractor circuit 116 includes an input terminal 116A that is coupled to an output terminal 106C of the preamplifier circuit 106 via the SDI circuitry 112, and includes an input terminal 116B that is coupled to an output terminal 108B of the preamplifier circuit 108 via the SDI circuitry 114. The integrated output of the Hall sensor 102 (which is operated in non-current spinning mode) includes offset voltage, and the integrated output of the Hall sensor 104 (which is operated in current spinning mode) does not include offset voltage. The output signal produced by the subtractor circuit 116 provides a measurement of the offset voltage in the output of the Hall sensor 102. The subtraction circuitry 110 may be implemented as analog circuitry, digital circuitry, or a combination thereof in various implementations of the Hall sensor circuit 100.

The subtractor circuit 116 is coupled to a low-pass filter 122. The low-pass filter 122 low-pass filters the output signal of the subtractor circuit 116, and has a bandwidth sufficient to allow for drift of the offset voltage. The low-pass filter 122 includes an input terminal 122A coupled to an output terminal 116C of the subtractor circuit 116. The low-pass filter 122 may be implemented as a digital filter or an analog filter in various implementations of the Hall sensor circuit 100.

The subtractor circuit 116 is coupled to a digital-to-analog converter (DAC) 124. The DAC 124 converts a digital value of the offset voltage to an analog offset voltage. The DAC 124 includes an input terminal 124A coupled to an output terminal 122B of the low-pass filter 122.

An output terminal 124B of the DAC 124 is coupled to an input terminal 106B of the preamplifier circuit 106. The preamplifier circuit 106 subtracts the analog offset voltage provided by the DAC 124 from the output signal of the Hall sensor 102. Thus, when the analog offset voltage generated by the DAC 124 is provided to the preamplifier circuit 106, the preamplifier circuit 106 subtracts the offset voltage from the output of the Hall sensor 102, to remove offset from the output of the preamplifier circuit 106 and provide an offset corrected output of the Hall sensor 102.

The subtractor circuit 116 is also coupled to a gain calibration circuit 120. The gain calibration circuit 120 is coupled to the bias current source 130 and the bias current source 132, and adjusts the bias currents generated by the bias current source 130 and the bias current source 132 based on the output of the subtractor circuit 116. The Hall sensors 102-105 may include excitation coils for use in gain calibration.

The Hall sensor circuit 100 includes duty cycling circuitry to reduce power consumption by cycling power to various components of the Hall sensor circuit 100. The Hall sensor circuit 100 includes an offset calibration duty cycling circuit 126 and a Hall measurement duty cycling circuit 128. The offset calibration duty cycling circuit 126 controls power cycling or activation of the various circuits of the Hall sensor circuit 100 that are used to determine the offset voltage of the Hall sensors. For example, the offset calibration duty cycling circuit 126 controls power cycling of the low-pass filter 122, the subtraction circuitry 110, the preamplifier circuit 108 and the Hall sensors 104 and 105 (via the bias current source 130). The offset calibration duty cycling circuit 126 may power on these circuits and components relatively infrequently (e.g., for 20 microsecond/second) to measure the offset of the Hall sensors.

The Hall measurement duty cycling circuit 128 controls power cycling of the various circuits of the Hall sensor circuit 100 that provide a Hall measurement output signal for use by external circuitry. For example, the Hall measurement duty cycling circuit 128 controls power cycling or activation of the preamplifier circuit 106, the DAC 124, and the Hall sensors 102 and 103 (via the bias current source 132). The Hall measurement duty cycling circuit 128 may power these circuits and components relatively infrequently (e.g., 2 microseconds out of every 50 milliseconds) to provide a magnetic field measurement. Thus, the sensing time of the Hall sensor circuit 100 is relatively low, and because the duty cycling rate of the offset calibration duty cycling circuit 126 is lower than that of the Hall measurement duty cycling circuit 128, the power consumption of the Hall sensor circuit 100 is also relatively low. Operation of the Hall measurement duty cycling circuit 128 may be synchronized with operation of the offset calibration duty cycling circuit 126 to provide for powering of the Hall sensor 102, the preamplifier circuit 106, and other circuitry controlled by the Hall measurement duty cycling circuit 128 that determines the offset voltage present in the output of the Hall sensor 102.

Figure 2:
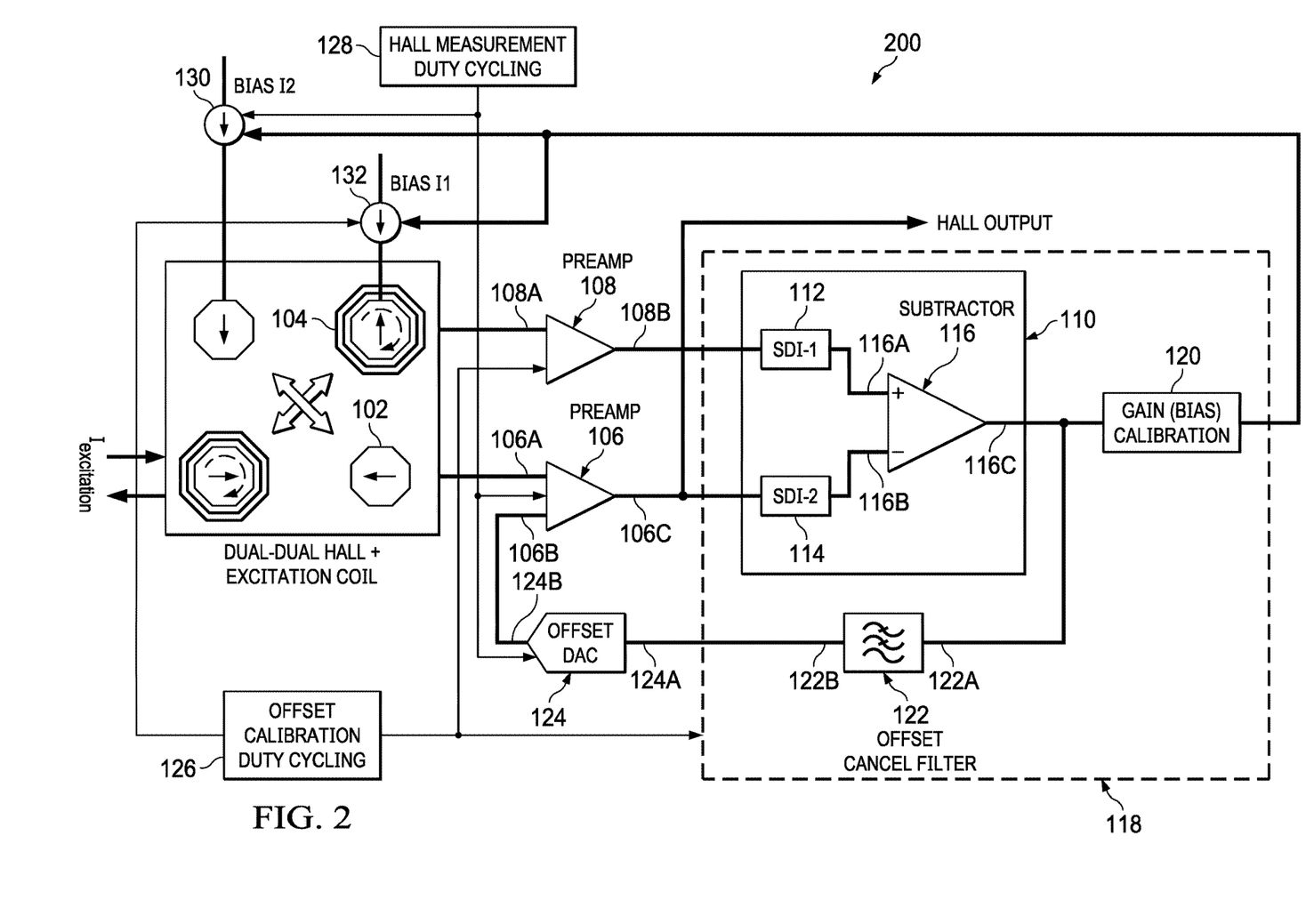
FIG. 2 illustrates an example Hall sensor circuit that includes duty cycling as described herein.

FIG. 2 illustrates an example Hall sensor circuit 200 that includes duty cycling as described herein. The Hall sensor circuit 200 is similar to the Hall sensor circuit 100, and differs from the Hall sensor circuit 100 in that the inputs to the subtractor circuit 116 are swapped with reference to the preamplifier circuits 106 and 108. In the Hall sensor circuit 200, the input terminal 116A of the subtractor circuit 116 is coupled to the output terminal 108B of the preamplifier circuit 108 and the input terminal 116B of the subtractor circuit 116 is coupled to the output terminal 106C of the preamplifier circuit 106.

Figure 3:
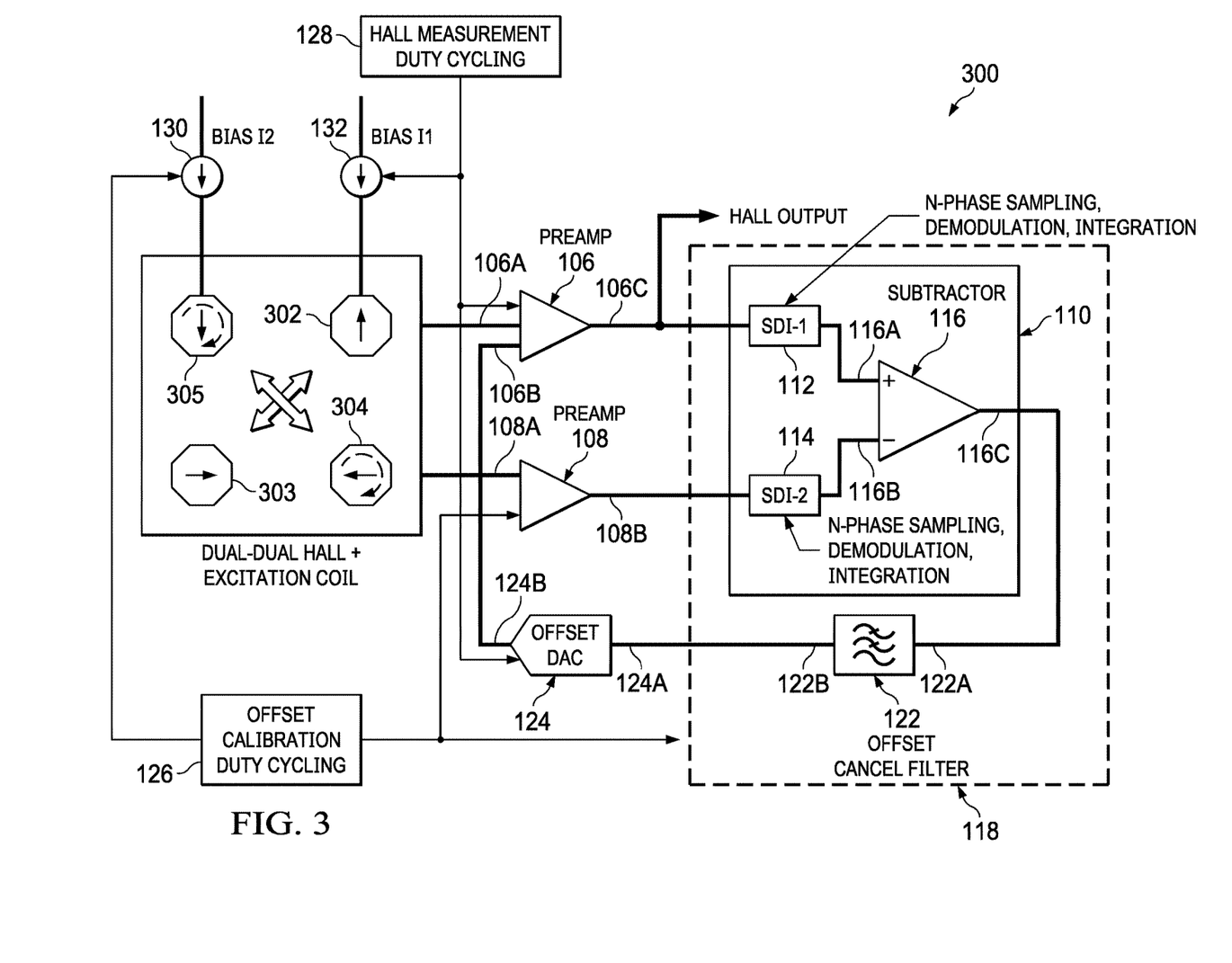
FIG. 3 illustrates an example Hall sensor circuit that includes duty cycling as described herein.

FIG. 3 illustrates an example Hall sensor circuit 300 that includes duty cycling as described herein. The Hall sensor circuit 300 is similar to the Hall sensor circuit 100, and differs from the Hall sensor circuit 100 in that the Hall sensor circuit 300 lacks the gain calibration circuit 120 and the associated control of the bias current source 130 and the bias current source 132. The Hall sensors 302, 303, 304, and 305 may lack excitation coils. The gain calibration provided by the gain calibration circuit 120 and the excitation coils is unnecessary in some applications. For example, in applications that employ digital threshold detection, gain accuracy is unnecessary. The Hall sensor circuit 300 is suitable for use in such applications.

Figure 4:
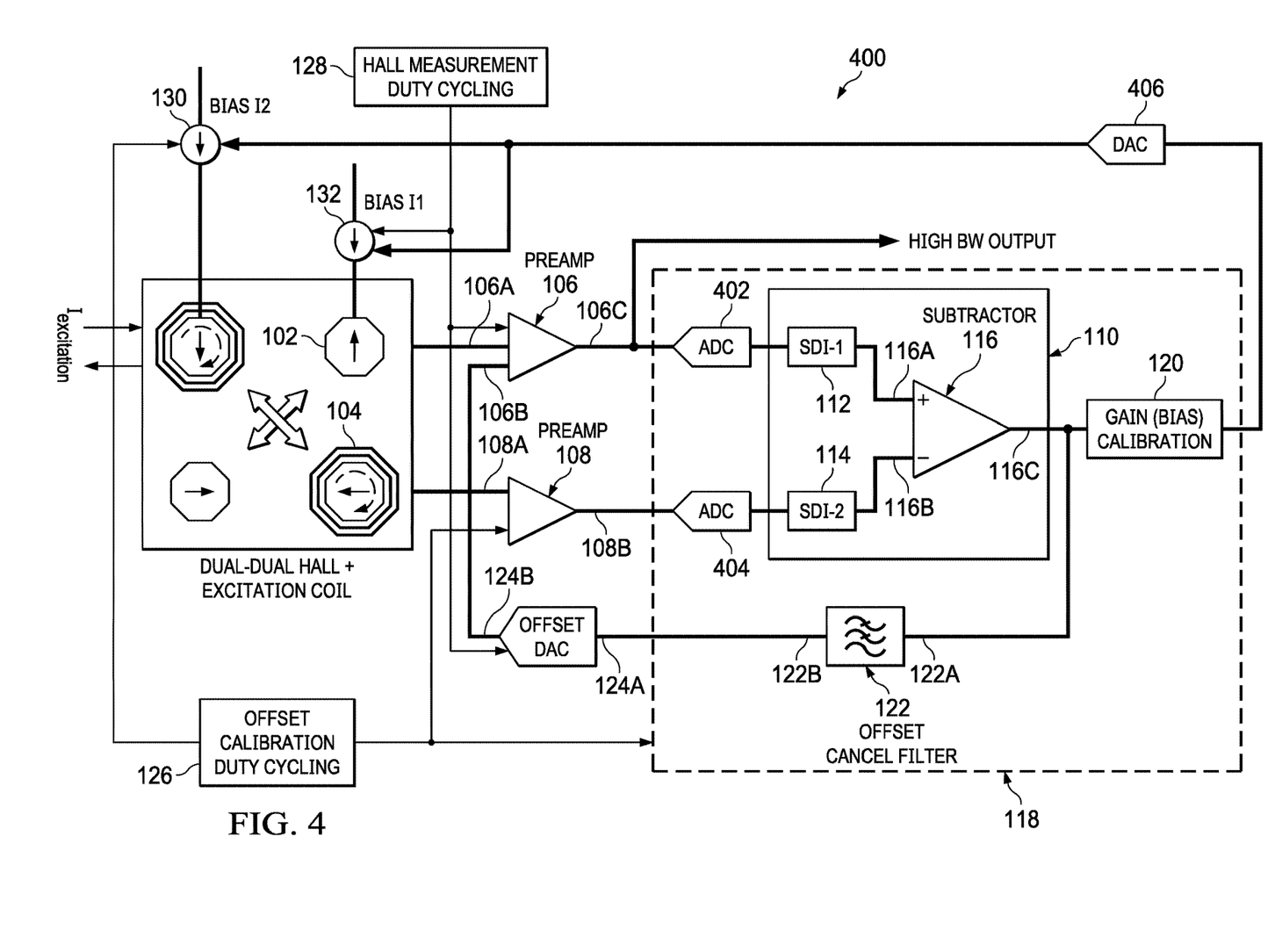
FIG. 4 illustrates an example Hall sensor circuit that includes duty cycling as described herein.

FIG. 4 illustrates an example Hall sensor circuit 400 that includes duty cycling as described herein. The Hall sensor circuit 400 is similar to the Hall sensor circuit 100. In the Hall sensor circuit 400, the subtraction circuitry 110, the gain calibration circuit 120, and the low-pass filter 122 are implemented using digital circuitry. Thus, the operations of the SDI circuitry 112, the SDI circuitry 114, the subtractor circuit 116, the gain calibration circuit 120, and the low-pass filter 122 are performed in the digital domain. To facilitate digital processing, the Hall sensor circuit 400 includes an analog-to-digital converter (ADC) 402, an ADC 404, and a DAC 406. The ADC 402 is coupled to the preamplifier circuit 106 and the SDI circuitry 112. The ADC 402 digitizes the output of the preamplifier circuit 106 and provides the digitized output of the preamplifier circuit 106 to the subtraction circuitry 110 for processing. Similarly, the ADC 404 digitizes the output of the preamplifier circuit 108 and provides the digitized output of the preamplifier circuit 108 to the subtraction circuitry 110 for processing. The DAC 406 is coupled to the gain calibration circuit 120, the bias current source 130, and the bias current source 132. The DAC 406 converts the digital output of the gain calibration circuit 120 to an analog signal for controlling that bias current source 130 and the bias current source 132.

Figure 5:
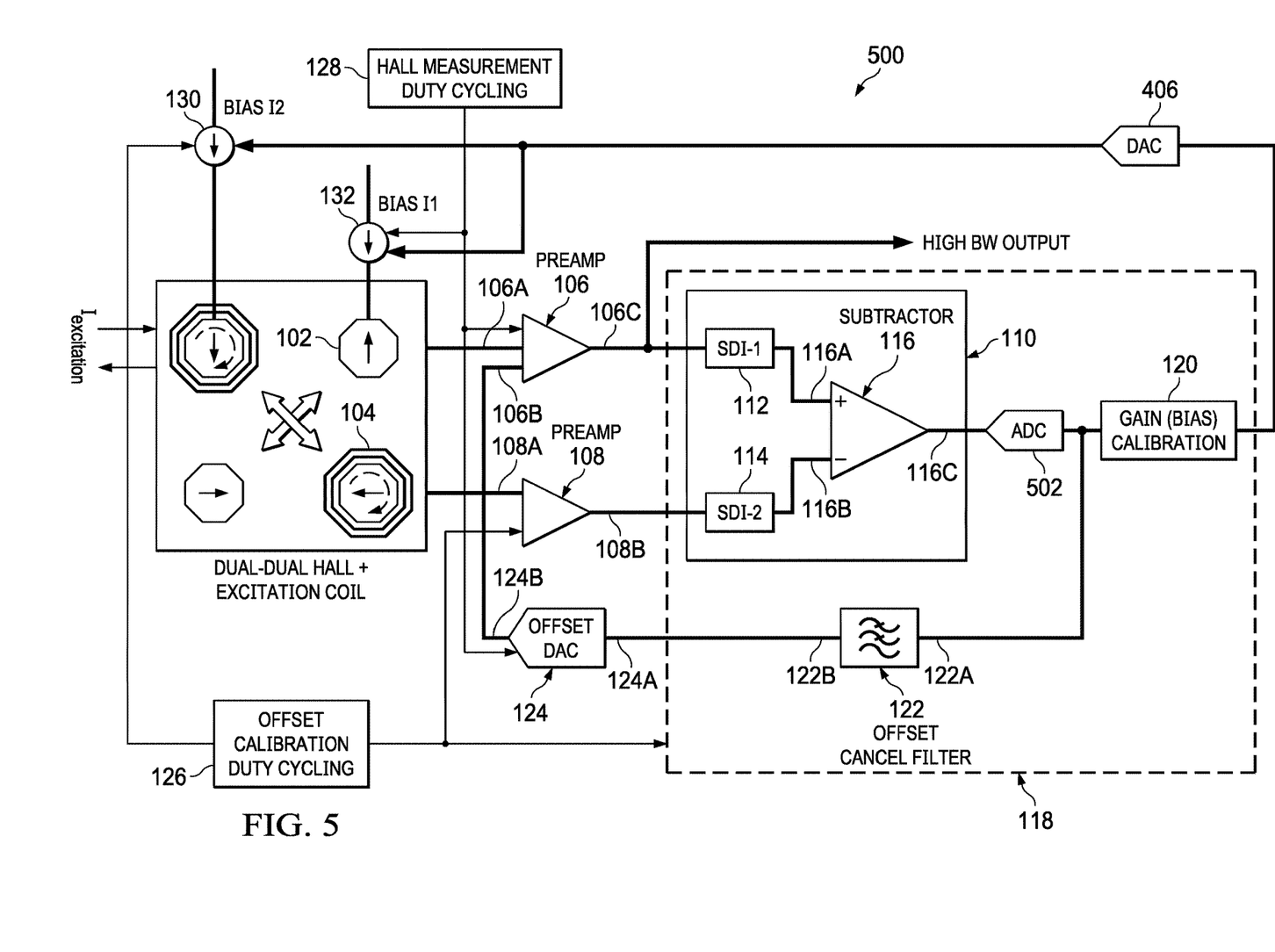
FIG. 5 illustrates an example Hall sensor circuit that includes duty cycling as described herein.

FIG. 5 illustrates an example Hall sensor circuit 500 that includes duty cycling as described herein. The Hall sensor circuit 500 is similar to the Hall sensor circuit 100. In the Hall sensor circuit 500, the gain calibration circuit 120 and the low-pass filter 122 are implemented using digital circuitry. Thus, the operations of the gain calibration circuit 120 and the low-pass filter 122 are performed in the digital domain. To facilitate digital processing, the Hall sensor circuit 500 includes an ADC 502 and a DAC 406. The ADC 502 is coupled to the subtractor circuit 116, the gain calibration circuit 120, and the low-pass filter 122. The ADC 502 digitizes the output of the subtractor circuit 116 and provides the digitized output of the subtractor circuit 116 to the gain calibration circuit 120 and the low-pass filter 122 for processing. The DAC 406 is coupled to the gain calibration circuit 120, the bias current source 130, and the bias current source 132. The DAC 406 converts the digital output of the gain calibration circuit 120 to an analog signal for controlling that bias current source 130 and the bias current source 132.

Implementations of the Hall sensor circuits (e.g., the Hall sensor circuit 100, 200, 300, 400, or 500) described herein may also include one or more magnetic concentrators aligned with the Hall sensors to concentrate magnetic flux for detection by the Hall sensors. The magnetic concentrators increase the sensitivity of the Hall sensor circuits. In some implementations of the Hall sensor circuits, the magnetic concentrators are formed/deposited on the integrated circuit by electroplating, sputtering, or a combination thereof, as part of wafer-level processing. Thus, the alignment of the magnetic concentrators and the Hall effect sensors is precisely controlled.

Figure 6:
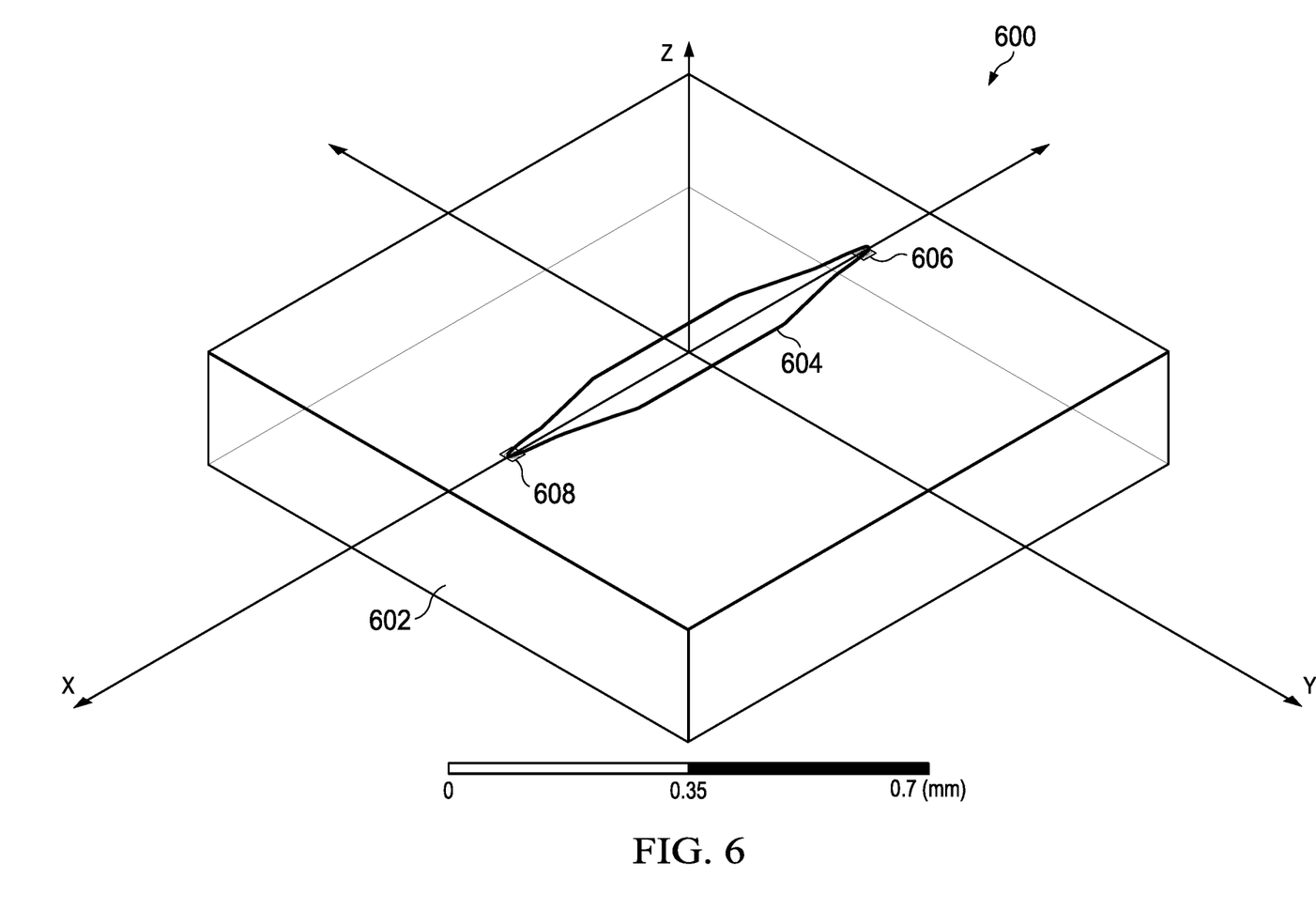
FIG. 6 illustrates an example magnetic concentrator formed on a substrate and aligned with a Hall sensor of a Hall sensor circuit as described herein.

FIG. 6 illustrates an example integrated circuit 600 that includes a magnetic concentrator 604 formed on a substrate 602. The magnetic concentrator 604 is aligned with a Hall sensor 606, and a Hall sensor 608 of a Hall sensor circuit as described herein. The Hall sensors 606 and 608 may be implementations of the Hall sensor 102, the Hall sensor 103, the Hall sensor 104, or the Hall sensor 105. The magnetic concentrator 604 is formed in the shape of a wedge, and concentrates magnetic flux for detection by the Hall sensors 606 and 608. The magnetic concentrator 604 may be formed by depositing a soft magnetic material, such as Ni, Co, Fe, NiFe, CoNiFe, CoTaZr on the substrate 602.

Figure 7:
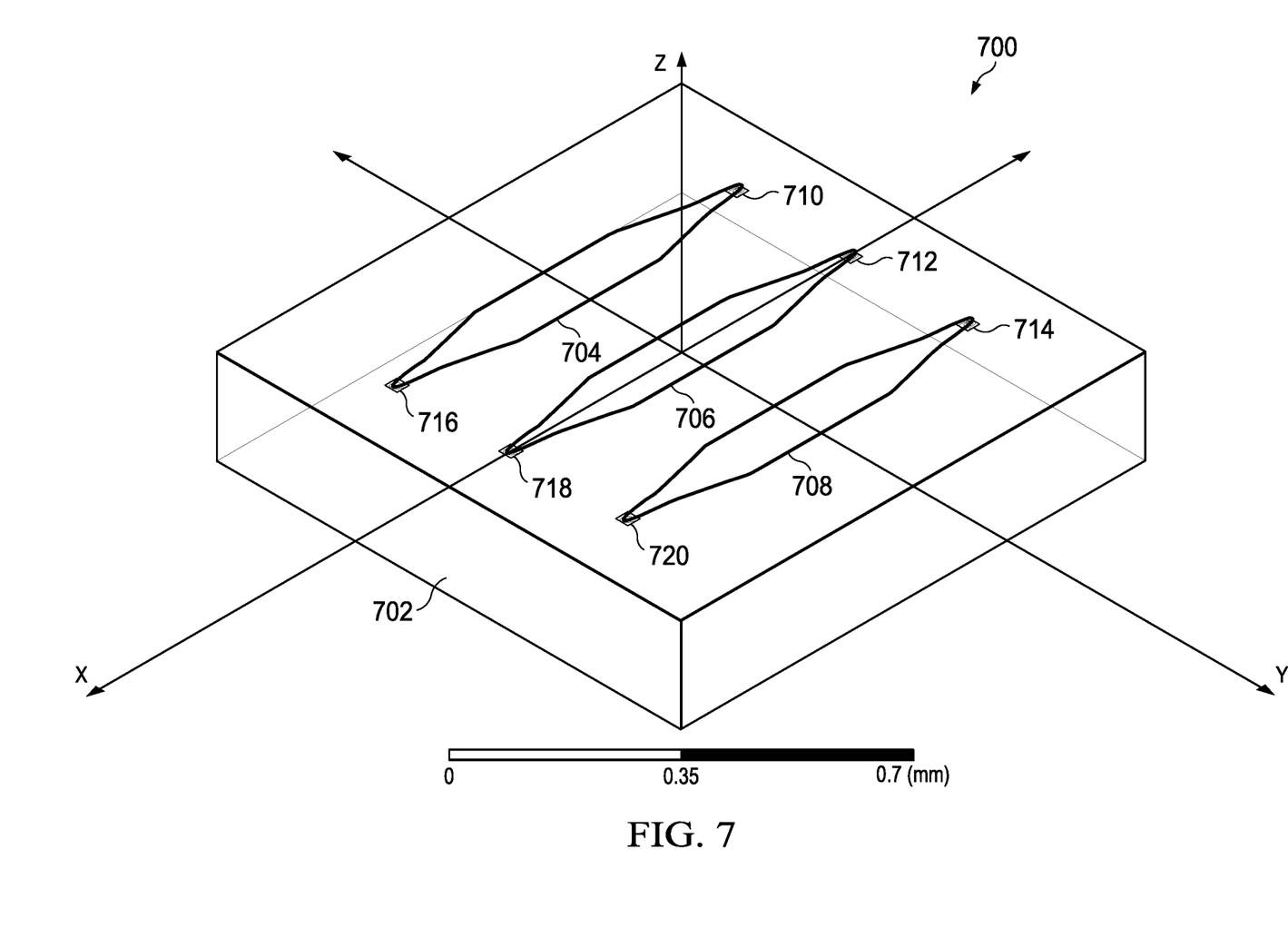
FIG. 7 illustrates an example of multiple magnetic concentrators formed on a substrate and aligned with Hall sensors of a Hall sensor circuit as described herein.

FIG. 7 illustrates an example integrated circuit 700 that includes magnetic concentrators 704, 706, and 708 formed on a substrate 702. The magnetic concentrator 704 is aligned with Hall sensors 710 and 716. The magnetic concentrator 706 is aligned with Hall sensors 712 and 718. The magnetic concentrator 708 is aligned with Hall sensors 714 and 720. The Hall sensor 710, the Hall sensor 712, the Hall sensor 714, the Hall sensor 716, the Hall sensor 718, and the Hall sensor 720 may be implementations of the Hall sensor 102, the Hall sensor 103, the Hall sensor 104, or the Hall sensor 105. The magnetic concentrators 704, 706, and 708 are formed in the shape of a wedge, and concentrate magnetic flux for detection by the Hall sensor 710, the Hall sensor 712, the Hall sensor 714, the Hall sensor 716, the Hall sensor 718, and the Hall sensor 720. The magnetic concentrators 704, 706, and 708 may be formed by depositing a soft magnetic material, such as Ni, Co, Fe, NiFe, CoNiFe, CoTaZr on the substrate 702.

Figure 8:
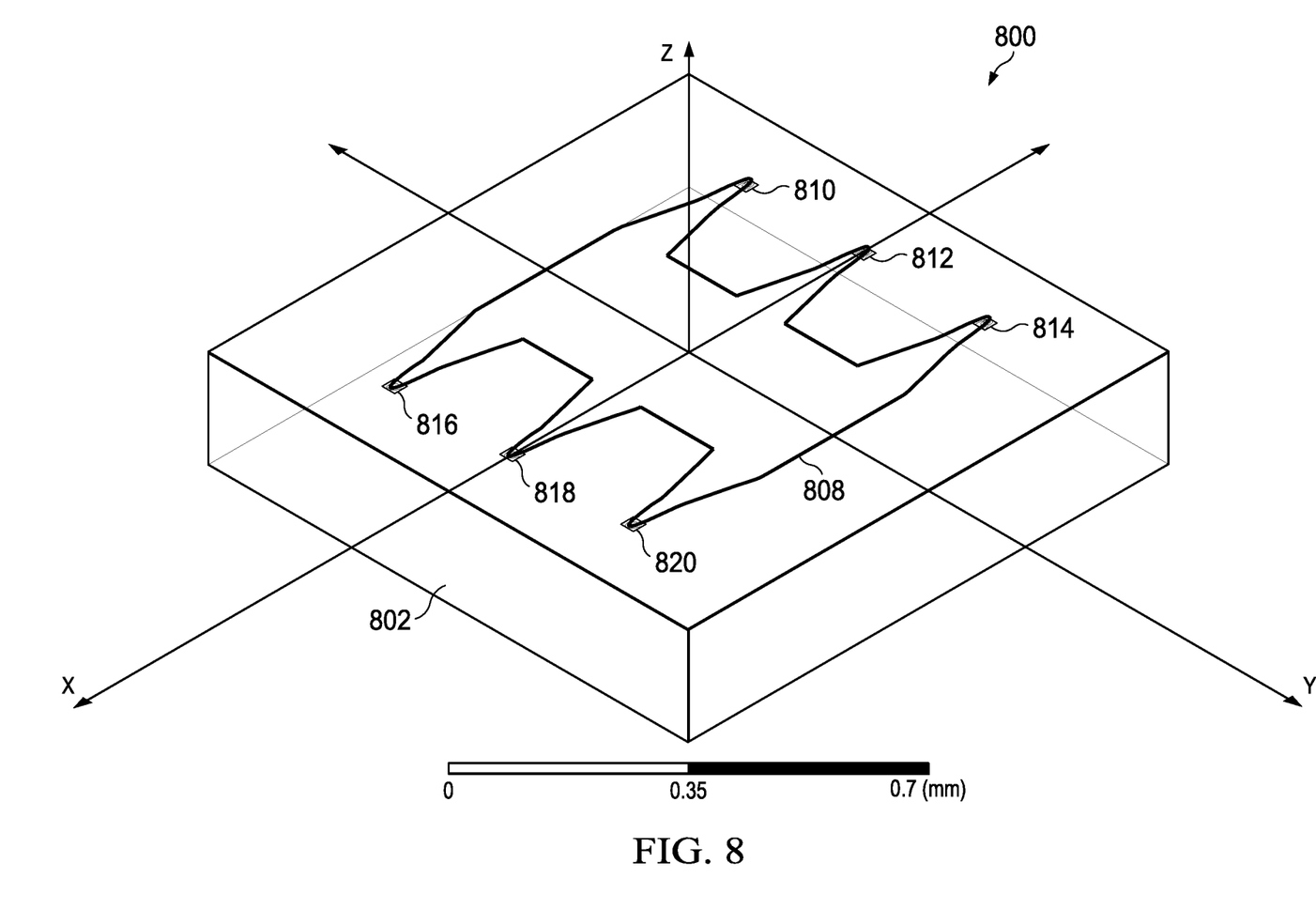
FIG. 8 illustrates an example magnetic concentrator formed on a substrate and aligned with multiple Hall sensors of a Hall sensor circuit as described herein.

FIG. 8 illustrates an example integrated circuit 800 that includes a magnetic concentrator 808 formed on a substrate 802. The magnetic concentrator 808 is formed as a merged group of the magnetic concentrators of FIG. 7. The magnetic concentrator 808 is aligned with the Hall sensor 810, the Hall sensor 812, the Hall sensor 814, the Hall sensor 816, the Hall sensor 818, and the Hall sensor 820 of a Hall sensor circuit as described herein. The Hall sensor 810, the Hall sensor 812, the Hall sensor 814, the Hall sensor 816, the Hall sensor 818, and the Hall sensor 820 may be implementations of the Hall sensor 102, the Hall sensor 103, the Hall sensor 104, or the Hall sensor 105. The magnetic concentrator 808 concentrates magnetic flux for detection by the Hall sensor 810, the Hall sensor 812, the Hall sensor 814, the Hall sensor 816, the Hall sensor 818, and the Hall sensor 820. The magnetic concentrator 808 may be formed by depositing a soft magnetic material, such as Ni, Co, Fe, NiFe, CoNiFe, CoTaZr on the 802.

Figure 9:
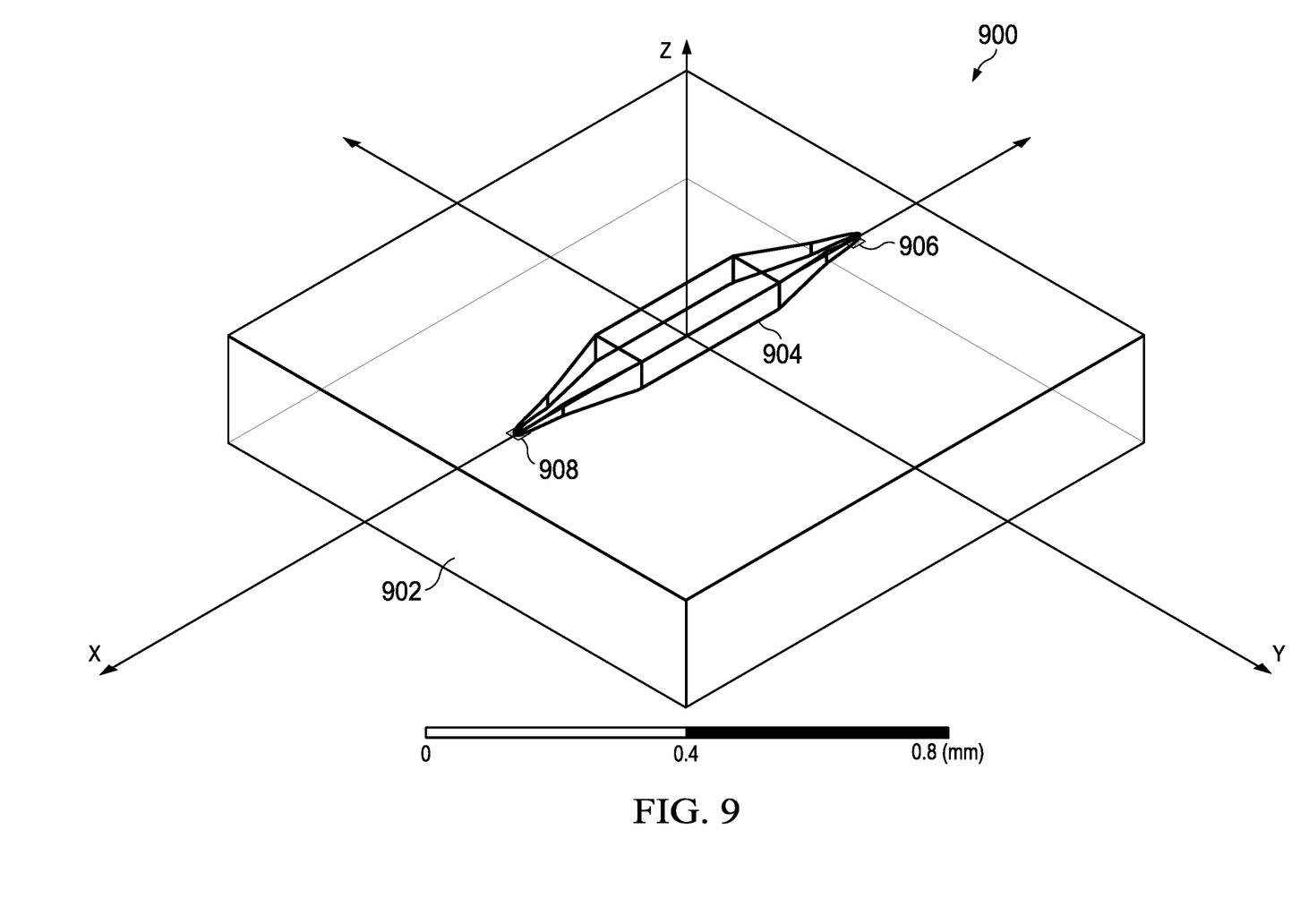
FIG. 9 shows a three-dimensional view of an example magnetic concentrator formed on a substrate and aligned with a Hall sensor of a Hall sensor circuit as described herein.

FIG. 9 shows a three-dimensional view of an example magnetic concentrator 904 formed on a substrate 902 and aligned with a Hall sensor 906 and a Hall sensor 908 of a Hall sensor circuit as described herein. The magnetic concentrator 904 may include multiple magnetic layers of a composition selected from a group consisting of Ni, Co, Fe, NiFe, CoNiFe, CoTaZr, and combinations thereof. The multiple magnetic layers may be separated from each other via an insulating layer including a composition selected from the group consisting of AlN, $Al_2O_3$ (or other dielectric material or high resistivity insulator material), and combinations thereof. The magnetic concentrator 904 may further include an electrically conducting metal layer positioned below the multiple magnetic layers. The electrically conducting metal layer may include a composition selected from the group consisting of Ti, W, Cu, and combinations thereof. The magnetic concentrator 904 may further include an outer layer at least partially encasing the multiple magnetic layers. The outer layer may include a composition selected from the group consisting of Ti, SiN, SiO2, SiON, and combinations thereof.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A Hall sensor circuit, comprising:
    a first Hall sensor;
    a second Hall sensor;
    a first preamplifier circuit comprising:
        an input coupled to the first Hall sensor;
        and an output;
    a second preamplifier circuit comprising:
        a first input coupled to the second Hall sensor;
        a second input; and
        an output;
    a subtractor circuit comprising:
        a first input coupled to the output of the first preamplifier circuit;
        a second input coupled to the output of the second preamplifier circuit; and
        an output coupled to the second input of the second preamplifier circuit; and
    a duty cycling circuit coupled to the second Hall sensor and the second preamplifier circuit.

2. The Hall sensor circuit of claim 1, further comprising:
    a digital-to-analog converter (DAC) comprising:
        an input coupled to the output of the subtractor circuit;
        and an output coupled to the second input of the second preamplifier circuit; wherein
        the duty cycling circuit is coupled to the DAC.

3. The Hall sensor circuit of claim 2, further comprising a low-pass filter comprising: an
    input coupled to the output of the subtractor circuit; and
    an output coupled to the input of the DAC.

4. The Hall sensor circuit of claim 1, wherein:
    the duty cycling circuit is a first duty cycling circuit; and
    the Hall sensor circuit comprises a second duty cycling circuit coupled to the first preamplifier circuit, the first Hall sensor, and the subtractor circuit.

5. The Hall sensor circuit of claim 4, wherein:
    the first duty cycling circuit is configured activate the second Hall sensor and the second preamplifier at a first rate; and
    the second duty cycling circuit is configured to activate the first Hall sensor, the first preamplifier circuit, and the subtractor circuit at a second rate; and the first rate is higher than the second rate.

6. The Hall sensor circuit of claim 1, further comprising:
    a first current source coupled to the first Hall sensor; and
    a second current source coupled to the second Hall sensor.

7. The Hall sensor circuit of claim 1, further comprising a magnetic concentrator aligned with the first Hall sensor.

8. The Hall sensor circuit of claim 1, further comprising a magnetic concentrator aligned with the second Hall sensor.

9. The Hall sensor circuit of claim 1, wherein the first Hall sensor is operated in current spinning mode and the second Hall sensor is operated in a non-current spinning mode.

10. A Hall sensor circuit, comprising:
    a first Hall sensor configured to operate in a current spinning mode;
    a second Hall sensor configured to operate in a non-current spinning mode;
    a first preamplifier circuit comprising:
        an input coupled to the first Hall sensor;
        and an output;
    a second preamplifier circuit comprising:
        a first input coupled to the second Hall sensor;
        a second input; and
        an output;
    a subtractor circuit comprising:
        a first input coupled to the output of the first preamplifier circuit;
        a second input coupled to the output of the second preamplifier circuit; and
        an output coupled to the second input of the second preamplifier circuit; and a magnetic concentrator aligned with the second Hall sensor.

11. The Hall sensor circuit of claim 10, further comprising a duty cycling circuit coupled to the first preamplifier circuit, the subtractor circuit, and the first Hall sensor, and configured to power cycle the first preamplifier circuit, the subtractor circuit, and the first Hall sensor at a first rate.

12. The Hall sensor circuit of claim 11, wherein:
    the duty cycling circuit is a first duty cycling circuit, and
    the Hall sensor circuit comprises a second duty cycling circuit coupled to the second Hall sensor and the second preamplifier circuit, and configured to power cycle the second Hall sensor and the second preamplifier circuit at a second rated.

13. The Hall sensor circuit of claim 12, wherein the second rate is higher than the first rate.

14. The Hall sensor circuit of claim 10, further comprising a digital-to-analog converter comprising:
    an input coupled to the output of the subtractor circuit;
    and an output coupled to the second input of the second preamplifier circuit.

15. The Hall sensor circuit of claim 10, wherein:
    the magnetic concentrator is a first magnetic concentrator; and
    the Hall sensor circuit comprises a second magnetic concentrator aligned with the first Hall sensor.

16. A Hall sensor circuit, comprising:
    a first Hall sensor configured to operate in a current spinning mode;
    a second Hall sensor configured to operate in a non-current spinning mode;
    a magnetic concentrator aligned with the second Hall sensor;
    a first preamplifier circuit comprising:
        an input coupled to the first Hall sensor; and
        an output;
    a second preamplifier circuit comprising:
        a first input coupled to the second Hall sensor;
        a second input;
        and an output;
    a subtractor circuit comprising:
        a first input coupled to the output of the first preamplifier circuit;
        a second input coupled to the output of the second preamplifier circuit; and
        an output coupled to the second input of the second preamplifier circuit;
    a first duty cycling circuit configured to power cycle the first preamplifier circuit, the subtractor circuit, and the first Hall sensor at a first rate; and a second duty cycling circuit configured to power cycle the second preamplifier circuit and the second Hall sensor at a second rate.

17. The Hall sensor circuit of claim 16, wherein the first rate is higher than the second rate.

18. The Hall sensor circuit of claim 16, further comprising a digital-to-analog converter (DAC) comprising:
   an input coupled to the output of the subtractor circuit; and
   an output coupled to the second input of the second preamplifier circuit.

19. The Hall sensor circuit of claim 18, further comprising:
   a low-pass filter comprising:
      an input coupled to the output of the subtractor circuit; and
      an output coupled to the input of the DAC.

20. The Hall sensor circuit of claim 19, further comprising an analog-to-digital converter comprising:
   an input coupled to the output of the subtractor circuit, and
   an output coupled to the input of the low-pass filter.

* * * * *